US010649056B2

(12) United States Patent
Bi et al.

(10) Patent No.: US 10,649,056 B2
(45) Date of Patent: May 12, 2020

(54) FREE-BREATHING 3D BODY DIFFUSION IMAGING USING MOTION-COMPENSATED DIFFUSION PREPARATION AND MOTION ROBUST READOUT

(71) Applicants: Siemens Healthcare GmbH, Erlangen (DE); Cedars-Sinai Medical Center, Los Angeles, CA (US)

(72) Inventors: Xiaoming Bi, Oak Park, CA (US); Christopher T. Nguyen, Hollywood, CA (US); Zhaoyang Fan, Hacienda Heights, CA (US); Yutaka Natsuaki, Riverside, CA (US); Debiao Li, South Pasadena, CA (US); Gerhard Laub, San Mateo, CA (US)

(73) Assignees: Siemens Healthcare GmbH, Erlangen (DE); Cedars-Sinai Medical Center, Los Angeles, CA (US)

( * ) Notice: Subject to any disclaimer, the term of this patent is extended or adjusted under 35 U.S.C. 154(b) by 271 days.

(21) Appl. No.: 15/698,837

(22) Filed: Sep. 8, 2017

(65) Prior Publication Data

US 2019/0079155 A1 Mar. 14, 2019

(51) Int. Cl.
*G01R 33/563* (2006.01)
*G01R 33/561* (2006.01)
(Continued)

(52) U.S. Cl.
CPC ... *G01R 33/56341* (2013.01); *G01R 33/4826* (2013.01); *G01R 33/50* (2013.01);
(Continued)

(58) Field of Classification Search
CPC .......... G01R 33/56341; G01R 33/5602; G01R 33/56509; G01R 33/4826; G01R 33/5613; G01R 33/50
(Continued)

(56) References Cited

U.S. PATENT DOCUMENTS 5,307,812 A * 5/1994 Hardy .................... A61B 18/24
600/411
5,382,902 A * 1/1995 Taniguchi .......... G01R 33/5676
324/307
(Continued)

OTHER PUBLICATIONS

Porter, David A., and Robin M. Heidemann. "High resolution diffusion-weighted imaging using readout-segmented echo-planar imaging, parallel imaging and a two-dimensional navigator-based reacquisition." Magnetic resonance in medicine 62.2 (2009): 468-475.

(Continued)

*Primary Examiner* — Christopher P McAndrew

(57) ABSTRACT

Embodiments can provide a computer-implemented method for free breathing three dimensional diffusion imaging, the method comprising initiating, via a k-space component processor, diffusion/T2 preparation, comprising generating diffusion contrast; and adjusting one or more of amplitude, duration, and polarity to set a first order moment; applying, via an image data processor, a stack of stars k-space ordering, comprising acquiring a radial/spiral view for all members of a plurality of partitions in a partition-encoding direction; increasing an azimuthal angle until a complete set of radial/spiral views are sampled; and applying diffusion gradients along each of three axis simultaneously; and calculating, via the image data processor, an apparent diffusion coefficient map.

23 Claims, 8 Drawing Sheets

(51) Int. Cl.
*G01R 33/50* (2006.01)
*G01R 33/48* (2006.01)
*G01R 33/56* (2006.01)
*G01R 33/565* (2006.01)

(52) U.S. Cl.
CPC ..... *G01R 33/5602* (2013.01); *G01R 33/5613* (2013.01); *G01R 33/56509* (2013.01)

(58) Field of Classification Search
USPC .......................................................... 324/307
See application file for complete search history.

(56) References Cited

U.S. PATENT DOCUMENTS

| | | | | |
|---|---|---|---|---|
| 5,488,297 | A * | 1/1996 | Nakada | G01R 33/56341 |
| | | | | 324/307 |
| 6,144,874 | A * | 11/2000 | Du | G01R 33/5676 |
| | | | | 324/307 |
| 6,815,952 | B1 * | 11/2004 | Rose | G01R 33/56518 |
| | | | | 324/307 |
| 8,308,628 | B2 * | 11/2012 | Creighton | H01F 7/0273 |
| | | | | 600/12 |
| 2005/0068031 | A1 * | 3/2005 | Frank | G01R 33/56341 |
| | | | | 324/309 |
| 2007/0156045 | A1 * | 7/2007 | Mistretta | G01R 33/4824 |
| | | | | 600/410 |
| 2008/0071167 | A1 * | 3/2008 | Ikedo | G01R 33/56316 |
| | | | | 600/419 |
| 2010/0171497 | A1 * | 7/2010 | Iwadate | G01R 33/5676 |
| | | | | 324/309 |
| 2012/0243756 | A1 * | 9/2012 | Samsonov | G01R 33/56509 |
| | | | | 382/131 |
| 2014/0294734 | A1 * | 10/2014 | Gulani | G01R 33/3614 |
| | | | | 424/9.32 |
| 2015/0077112 | A1 * | 3/2015 | Otazo | A61B 5/055 |
| | | | | 324/318 |
| 2015/0276909 | A1 * | 10/2015 | Kawaji | G01R 33/5673 |
| | | | | 600/413 |

OTHER PUBLICATIONS

Nguyen, Christopher, et al. 3D high-resolution diffusion-weighted MRI at 3T: Preliminary application in prostate cancer patients undergoing active surveillance protocol for low-risk prostate cancer. Magn Reson Med. 2016; 75:616-26.

Nguyen, Christopher, et al. "In vivo three-dimensional high resolution cardiac diffusion-weighted MRI: A motion compensated diffusion-prepared balanced steady-state free precession approach." Magnetic resonance in medicine 72.5 (2014): 1257-1267.

Chandarana, Hersh, et al. "Free-breathing contrast-enhanced multiphase MRI of the liver using a combination of compressed sensing, parallel imaging, and golden-angle radial sampling." Investigative radiology 48.1 (2013).

Bi, Xiaoming, et al. Motion-robust 3D Black-blood Carotid Wall Imaging Using Flow-sensitive Dephasing Preparation and Stack-of-Stars Trajectory. Proceedings of the International Society of Magnetic Resonance in Medicine's 23rd Scientific Meeting. Toronto, Canada. May 30-Jun. 5, 2015: 555.

Bi, Xiaoming, et al. 3D Carotid Wall Imaging: Stack-of-stars Trajectory for Multi-contrast Atherosclerosis characterization (STAR-MATCH). Proceedings of the International Society of Magnetic Resonance in Medicine's 24th Scientific Meeting. Singaport. May 7-13, 2016: 962.

Jenista, Elizabeth R., et al. "Motion and flow insensitive adiabatic T2-preparation module for cardiac MR imaging at 3 tesla." Magnetic resonance in medicine 70.5 (2013): 1360-1368.

* cited by examiner

FREE-BREATHING 3D BODY DIFFUSION IMAGING USING MOTION-COMPENSATED DIFFUSION PREPARATION AND MOTION ROBUST READOUT

TECHNOLOGY FIELD

The present invention relates generally to methods, systems, and apparatuses for utilizing patient respiratory signals and 3D deformable registration in order to provide three-dimensional motion correction for two-dimensional acquisition based (Magnetic Resonance) MR sequences, such as diffusion weighted imaging.

BACKGROUND

Diffusion-weighted (DW) MRI enables qualitative and quantitative assessment of tissue diffusivity without the use of contrast agent. While such method has gained great success in the brain, DW MRI remains challenging in the body (e.g., for liver imaging) particularly at 3T and higher field strengths. Diffusion-sensitizing gradients can lead to substantial signal loss in the targeted organ due to body motions (e.g., breathing, heart beating) beyond diffusion. Meanwhile, the conventional single-shot EPI diffusion sequence is challenged by limited spatial resolution, increased image distortion, and ghosting artifacts at high field strength. Previous work demonstrated that a first-order moment (M1) nullified gradient module significantly increases the tolerance of diffusion preparation to cardiac and respiratory motions. Furthermore, stack-of-stars sampling scheme has been shown to be a motion-robust method and was successfully utilized for free-breathing body imaging.

MRI has been increasingly used for the diagnosis of patients with body diseases due to distinct advantages of MRI when compared to competing imaging modalities: 1) MRI provides excellent soft tissue contrast; 2) MRI procedures are free from ionizing radiations. For oncological imaging, diffusion-weighted (DW) MRI enables qualitative and quantitative assessment of tissue diffusivity without the use of exogenous contrast media. Although readout-segmented EPI sequence alleviates some of these challenges, its performance can still be compromised by motion and misregistration between multiple readout segments. For diffusion imaging in the body, its efficiency is further compromised by segmenting readout and acquiring additional navigator for respiratory motion control.

Recent work has demonstrated that diffusion-prepared sequence can be used for imaging prostate cancer patients undergoing active surveillance protocol for low-risk prostate cancer. For moving organs such as the heart, a first-order moment (M1) nullified gradient module significantly increases the tolerance of diffusion preparation to motions. In combination with navigator-gating and electrocardiogram triggering, the feasibility of diffusion-weighted imaging has been demonstrated in the heart using such a motion compensated diffusion preparation scheme. From a data acquisition perspective, a stack-of-stars (SOS) sampling scheme was also shown to be a motion robust method and was successfully utilized for free-breathing, contrast-enhanced multiphase imaging of the liver. Such method was also used for improving the delineation of carotid vessel wall that was challenged by pulsation of carotid arteries and swallowing of a subject during data acquisition.

SUMMARY

Embodiments can provide a computer-implemented method for free breathing three dimensional diffusion imaging, the method comprising initiating, via a k-space component processor, diffusion/T2 preparation, comprising: generating diffusion contrast; and adjusting one or more of amplitude, duration, and polarity to set a first order moment; applying, via an image data processor, a motion robust, non-Cartesian k-space ordering, comprising: acquiring a radial/spiral view for all members of a plurality of partitions in a partition-encoding direction; increasing an azimuthal angle until a complete set of radial/spiral views are sampled; and applying diffusion gradients along each of three axis simultaneously; and calculating, via the image data processor, an apparent diffusion coefficient map.

Embodiments can further provide a method further comprising generating, via the k-space component processor, diffusion contrast through adding diffusion-sensitizing gradients to a T2-preparation module encompassing hard pulse excitation and adiabatic pulse refocusing.

Embodiments can further provide a method further comprising combining, via the image data processor, along with the stack of stars k-space ordering, one or more of a gradient-echo readout (steady-state free precession (SSFP), a fast low-angle shot (FLASH)), or a turbo spin-echo (TSE) readout.

Embodiments can further provide a method further comprising setting, via the k-space component processor, one or more of a b-value, T2-prep time, and selective nullification of the first order moment.

Embodiments can further provide a method further comprising setting, via the k-space component processor, one or more of a b-value, T2-prep time, and selective nullification of a second order moment or a higher moment.

Embodiments can further provide a method further comprising adjusting, via the k-space component processor, one or more of the amplitude, duration, and polarity to set a zeroth order moment.

Embodiments can further provide a method further comprising setting, via the k-space component processor, one or more of the b-value, T2-prep time, and selective nullification of the zeroth order moment.

Embodiments can further provide a method further comprising applying, via the k-space component processor, a spoiler gradient at the end of the diffusion/T2 preparation.

In another illustrative embodiment, a computer program product comprising a computer usable or readable medium having a computer readable program is provided. The computer readable program, when executed on a processor, causes the processor to perform various ones of, and combinations of, the operations outlined above with regard to the method illustrative embodiment.

In yet another illustrative embodiment, a system is provided. The system may comprise a medical imaging device comprising a k-space component processor and an imaging data processor configured to perform various ones of, and combinations of, the operations outlined above with regard to the method illustrative embodiment.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

The following disclosure describes the present invention according to several embodiments directed at methods, systems, and apparatuses related to a motion robust diffusion sequence incorporating an M1-compensated diffusion preparation module and motion robust, non-Cartesian data acquisition. In this invention, a method for improving diffusion imaging in the body is described. A motion robust, non-Cartesian ordering, such as stack of stars or stack of spirals readout can be utilized to enable high-resolution three-dimensional imaging under free-breathing. Instead of an EPI sequence, alternative readout schemes, such as steady-state free precession (SSFP), fast low-angle shot (FLASH), or turbo spin-echo (TSE), can be combined with such SOS k-space ordering. These readout methods can be readily segmented with minimal distortion and phase-error related artifacts as observed in conventional EPI sequence. Using $1^{st}$ order or $2^{nd}$ order moment nullified gradient scheme, signal loss in diffusion preparation resulting from macroscopic motion beyond diffusion is minimized. Combining such a motion robust diffusion preparation module with motion insensitive readout, high quality, three dimensional body diffusion images can be acquired under free-breathing.

Figure 1:
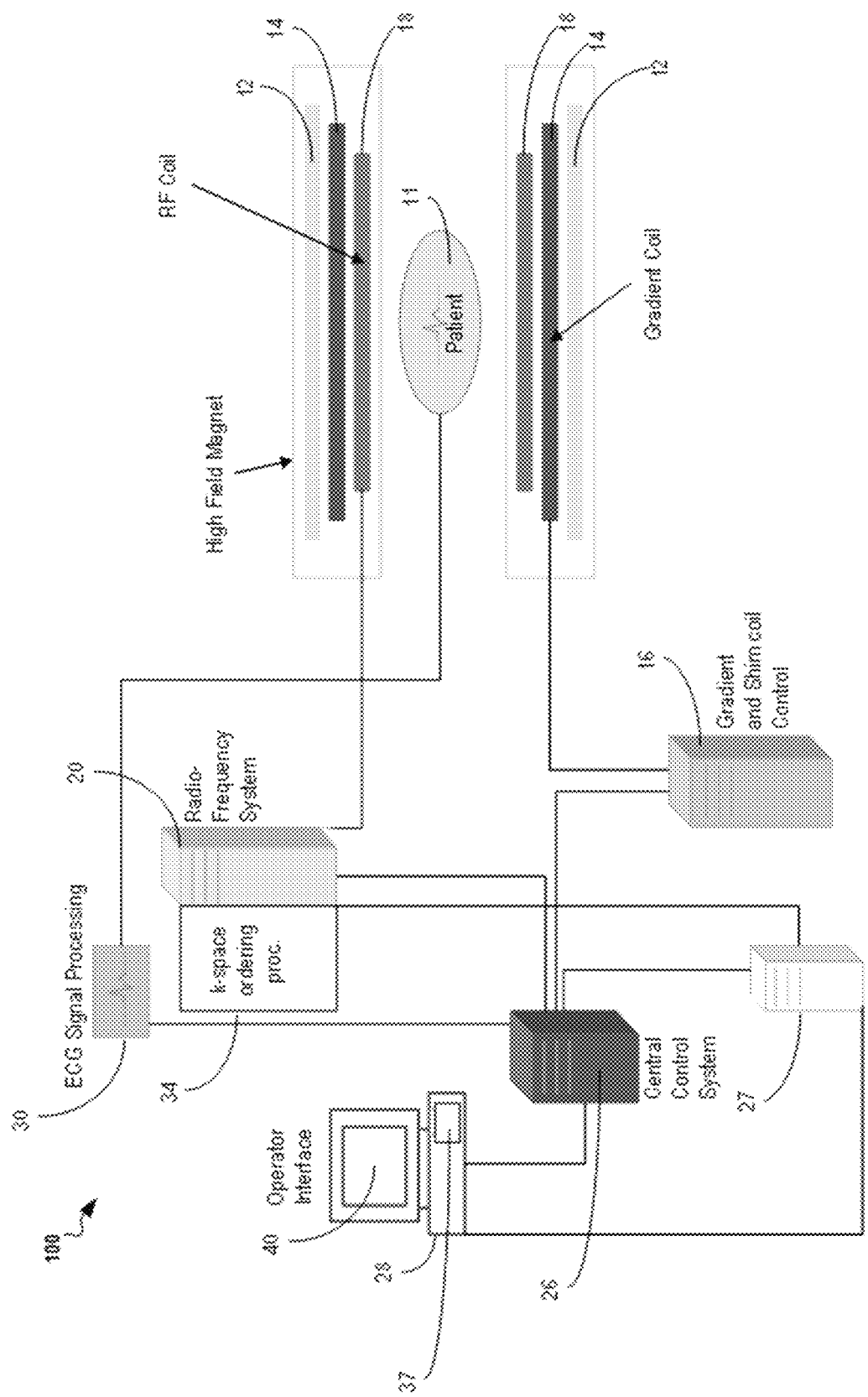
FIG. 1 shows a medical imaging device for free breathing three dimensional diffusion imaging, as used by some embodiments of the present invention.

FIG. 1 shows a medical imaging device 100 for free breathing three dimensional diffusion imaging, as used by some embodiments of the present invention. In medical imaging device 100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in a Magnetic Resonance Imaging (MRI) device magnetic field resulting from patient anatomical variation and other sources. The magnetic field gradients include a slice-selection gradient magnetic field, a phase-encoding gradient magnetic field and a readout gradient magnetic field that are applied to patient 11.

Further Radio Frequency (RF) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives magnetic resonance signals, i.e., signals from the excited protons within the body as they return to an equilibrium position established by the static and gradient magnetic fields. The magnetic resonance signals are detected and processed by a detector within RF module 20 and k-space component processor unit 34 to provide a magnetic resonance dataset to an image data processor for processing into an image. In some embodiments, the image data processor is located in central control unit 26. However, in other embodiments such as the one depicted in FIG. 1, the image data processor is located in a separate unit 27. Electrocardiography (ECG) synchronization signal generator 30 provides ECG signals used for pulse sequence and imaging synchronization. A two or three dimensional k-space storage array of individual data elements in k-space component processor unit 34 stores corresponding individual frequency components comprising a magnetic resonance dataset. The k-space array of individual data elements has a designated center and individual data elements individually have a radius to the designated center.

A magnetic field generator (comprising coils 12, 14, and 18) generates a magnetic field for use in acquiring multiple individual frequency components corresponding to individual data elements in the storage array. The individual frequency components are successively acquired in an order in which the radius of respective corresponding individual data elements increases and decreases along a substantially spiral path as the multiple individual frequency components are sequentially acquired during acquisition of a magnetic resonance dataset representing a magnetic resonance image. A storage processor in the k-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components which are substantially minimized.

Central control unit 26 uses information stored in an internal database to process the detected magnetic resonance signals in a coordinated manner to generate high quality images of a selected slice(s) of the body (e.g., using the image data processor) and adjusts other parameters of medical imaging device 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control unit 26 and enables user modification of magnetic resonance imaging signals in substantially real time. Continuing with reference to FIG. 1, display processor 37 processes the magnetic resonance signals to reconstruct one or more images for presentation on display 40, for example. Various techniques generally known in the art may be used for reconstruction.

Figure 2:
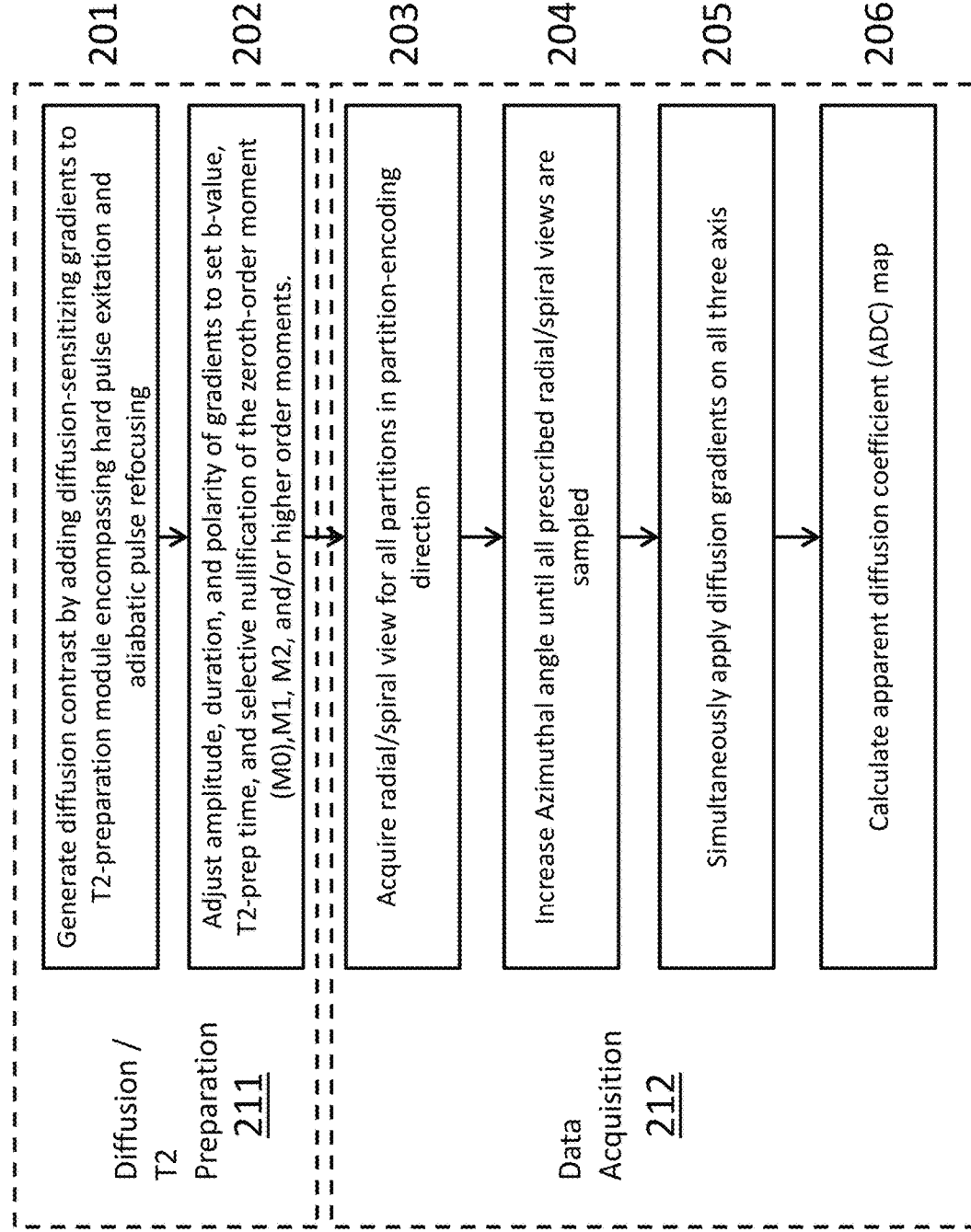
FIG. 2 illustrates a flowchart depicting the functionality of the motion correction system, in accordance with embodiments discussed herein.

FIG. 2 illustrates a flowchart depicting the functionality of the motion correction system, in accordance with embodiments discussed herein. In an embodiment, the motion correction system can first initiate diffusion/T2 preparation 211, followed by data acquisition 212 using a motion robust, non-Cartesian ordering methodology, including, but not limited to stack of stars or stack of spirals. To begin, the system can generate diffusion contrast by adding diffusion-sensitizing gradients to T2-preparation module encompassing hard pulse excitation and adiabatic pulse refocusing 201. Then, the system can adjust amplitude, duration, and polarity of gradients to set b-value, T2-prep time, and selective nullification of the zeroth-order moment (M0), first order moment (M1), second order moment (M2), and/or any higher order moment 202. After diffusion/T2 preparation 211, the system can move to data acquisition 212, which can begin with the system acquiring a radial/spiral view for all partitions in a partition-encoding direction 203. The system can then increase the azimuthal angle until all prescribed radial/spiral views are sampled 204. The system can then simultaneously apply diffusion gradients along all three axis 205, and can then calculate an apparent diffusion coefficient (ADC) map 206. Instead of an EPI sequence, alternative readout schemes, such as a gradient-echo readout such as steady-state free precession (SSFP) or fast low-angle shot (FLASH), or a turbo spin-echo (TSE) readout, can be combined with such motion robust, non-Cartesian ordering methodology.

Figure 3:
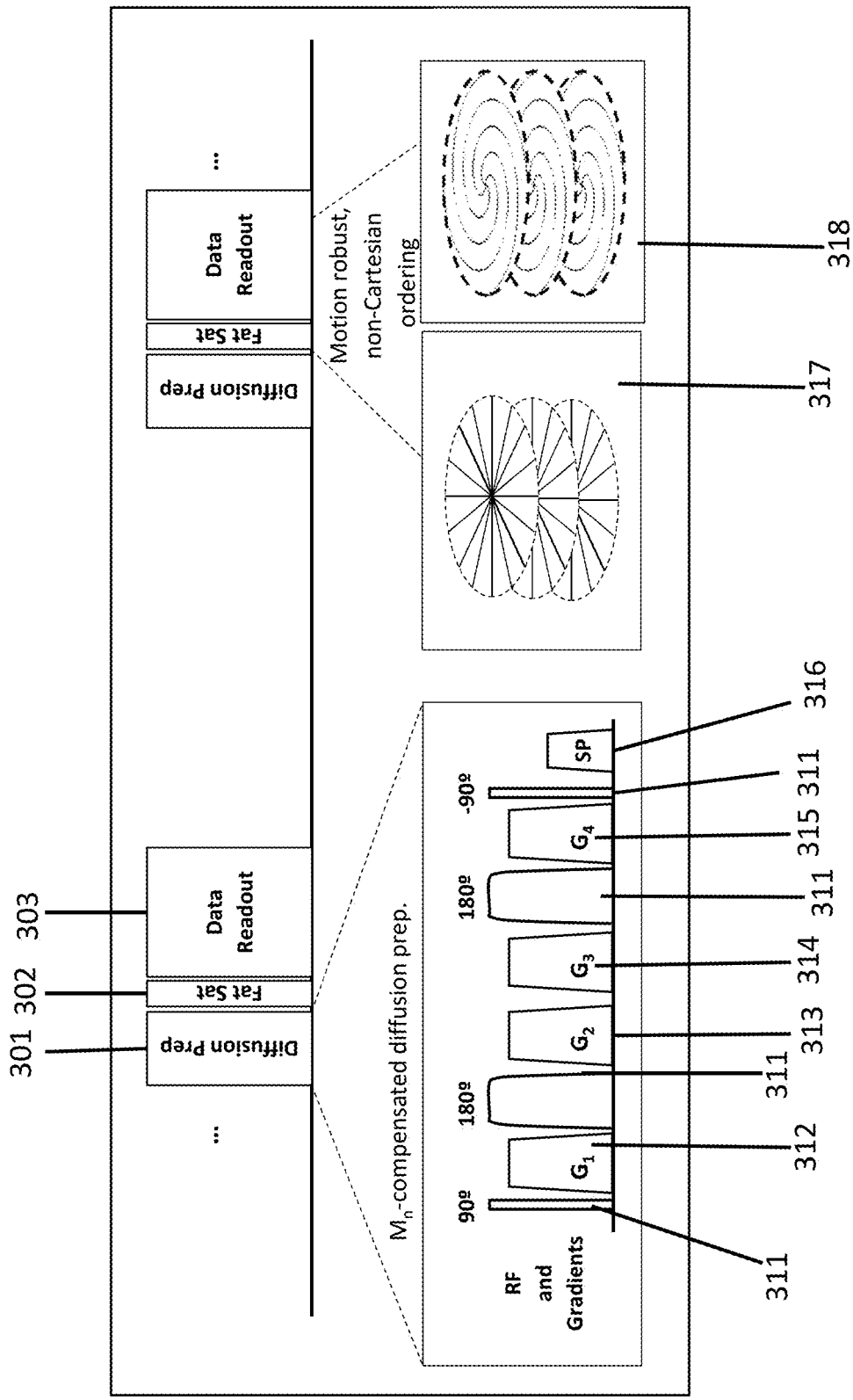
FIG. 3 illustrates a schematic diagram of a proposed 3D sequence for free-breathing body diffusion imaging using the motion correction system, in accordance with embodiments described herein.

FIG. 3 illustrates a schematic diagram of a proposed 3D sequence for free-breathing body diffusion imaging using the motion correction system, in accordance with embodiments described herein. Diffusion contrast can be generated in the diffusion preparation module by adding diffusion-sensitizing gradients to a T2-preparation module encompassing hard pulse excitation and adiabatic pulse refocusing. Magnetization preparations can include diffusion/T2 preparation 301 and fat saturation 302, followed by a data readout 303. For illustration, M1-compensated gradients are shown in FIG. 3. In an embodiment the amplitude, duration, and polarity of diffusion-sensitizing gradients G1 312, G2 313, G3 314, and G4 315 can be adjusted to generate a T2prep where b is equal to zero s/mm$^2$, and diffusion preparation can be adjusted with M0- or M1-, M2-compensation as needed. RF pulses 311 can be interspersed between the gradients. A spoiler (SP) gradient 316 can be applied at the end of the magnetization preparation 301. Such diffusion/T2 preparation module can be immediately followed by fat saturation and motion robust, non-Cartesian ordering data readout. In an embodiment, images can be acquired using an SSFP/FLASH/TSE readout with a motion robust, non-Cartesian ordering, including, but not limited to stack of stars 317 or stack of spirals 318. For each TR (which, in an embodiment, can be one second), the same radial/spiral view can be acquired for all partitions using centric ordering.

To validate this idea, the previously described sequence was implemented as a prototype sequence and tested on volunteers. In a preliminary study, five healthy volunteers (34.4±3.4 years, 4 males) were scanned on 3T clinical scanners (MAGNETOM Verio and Prisma, Siemens Healthcare, Germany). In addition, one patient (35-year-old female) scheduled for a complex ovarian cyst evaluation on an MR-PET scanner (Biograph mMR, Siemens Healthcare, Germany) was also enrolled. For each subject, T2-weighted (T2W) images (T2prep=72 ms, b=0 s/mm$^2$) and M1-compensated DW images (T2prep=72 ms, b=500 s/mm$^2$) were acquired under freebreathing conditions.

To investigate the necessity of M1 compensation in the diffusion preparation module, additional M0-compensated DW images were collected from two volunteers. For data acquisition, stack-of-stars k-space ordering was used in all measurements. Following each diffusion/T2 preparation module, same radial/spiral view was acquired for all partitions with centric order in the partition-encoding direction. Such magnetization preparation and data readout modules were repeatedly applied (repetition time 1s) with increased Azimuthal angle until all prescribed radial/spiral views were sampled. Other imaging parameters include: FOV=300 mm; 44 partitions; 264 projections; 2.1×2.1×2.0 mm3 voxel size. FA=45°; TR/TE=3.4/1.7 ms; diffusion gradients (29.7 mT/m; 6.5/12 ms for M0/M1-compensation for b=500 s/mm2) were simultaneously applied on all three axis. In this study, SSFP readout with 6 Kaiser-Bessel ramp-ups was utilized although FLASH or TSE readout should also work in principle. Apparent diffusion coefficient (ADC) map was calculated offline using in-house developed MATLAB scripts. T2W and DW images were successfully acquired from all subjects who underwent the imaging session. Using the previously described imaging parameters, the total imaging time for acquiring T2W and DW image sets was close to 9 minutes (4'24"×2). All values described above illustrate a sample embodiment of settings to be used with the present system, however, alternate settings are contemplated.

Figure 4A:
FIGS. 4A-4B illustrate sample images acquired using the proposed 3D sequence for free-breathing body diffusion imaging using the motion correction system, in accordance with embodiments described herein.
Figure 4B:

FIGS. 4A-4B illustrate sample images acquired using the proposed 3D sequence for free-breathing body diffusion imaging using the motion correction system, in accordance with embodiments described herein. Specifically, FIG. 4A depicts a diffusion-weighted (b=500 s/mm$^2$) image acquired with the zeroth-order moment (M0) compensated diffusion preparation scheme, while FIG. 4B depicts an image acquired with a first-order (M1) moment compensated diffusion preparation scheme. As shown, despite shorter exposure times (50 ms vs 72 ms) using M0 preparation, the delineation of liver and surrounding tissues is markedly improved with the M1-compensated diffusion preparation module.

Figure 5B:
FIGS. 5A-5C illustrate sample images acquired using the proposed 3D sequence for free-breathing body diffusion imaging using the motion correction system, in accordance with embodiments described herein.
Figure 5A:
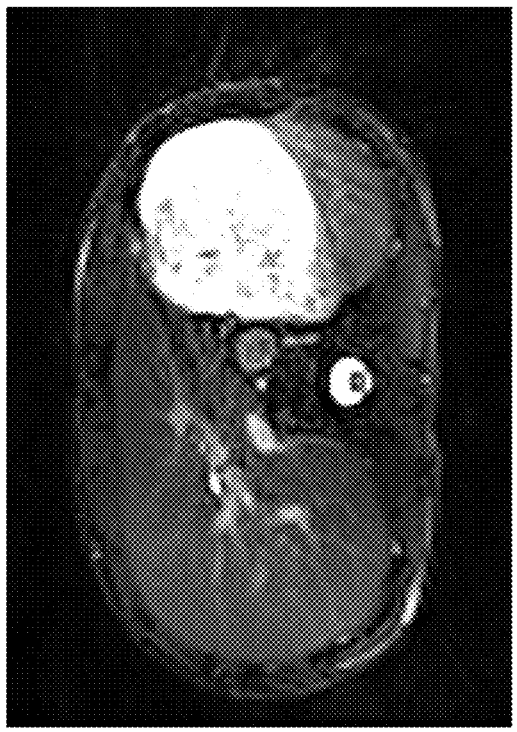
Figure 5C:

FIGS. 5A-5C illustrate sample images acquired using the proposed 3D sequence for free-breathing body diffusion imaging using the motion correction system, in accordance with embodiments described herein. Specifically, FIG. 5A depicts a T2-weighted (b=0 s/mm2, T2prep=72 ms) image, FIG. 5B depicts a diffusion-weighted (b=500 s/mm$^2$, T2prep=72 ms) image, and FIG. 5C depicts a corresponding ADC map from one selected partition. As shown, a homogeneous ADC map is acquired in the entire liver, where the mean ADC value in the liver can be 1.1±0.2 μm$^2$/ms.

Figure 6A:
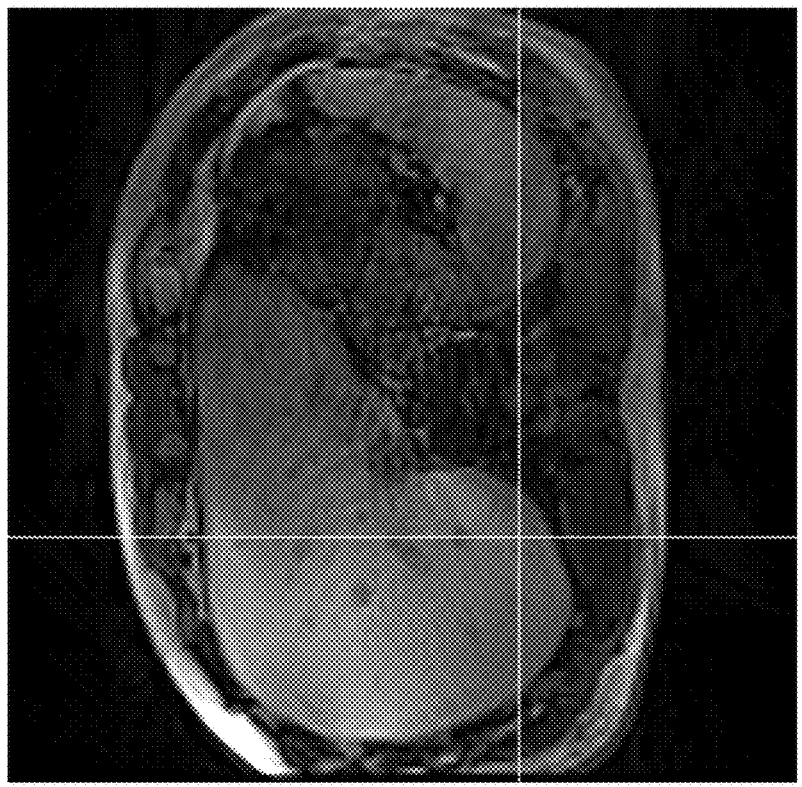
FIGS. 6A-6C illustrate sample images acquired using the proposed 3D sequence for free-breathing body diffusion imaging using the motion correction system, in accordance with embodiments described herein.
Figure 6C:
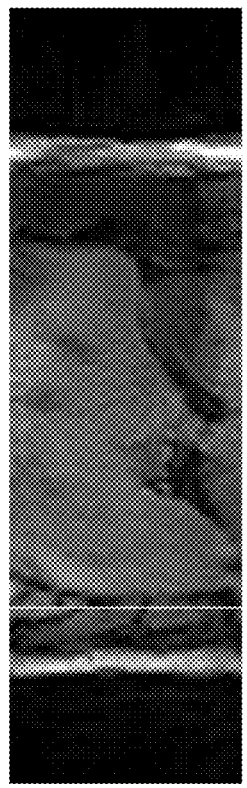
Figure 6B:
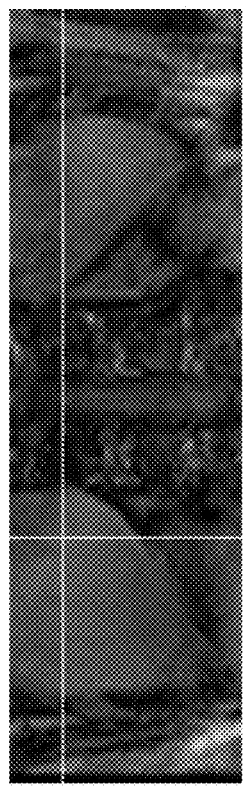

FIGS. 6A-6C illustrate sample images acquired using the proposed 3D sequence for free-breathing body diffusion imaging using the motion correction system, in accordance with embodiments described herein. Specifically, each of FIGS. 6A-6C depict an orthogonal view of a 3D diffusion-weighted (b=500 s/mm$^2$) image. In the images, the liver is well delineated in all view angles, although SSFP banding artifacts are noticeable outside of the liver.

Figure 7A:
FIGS. 7A-7D illustrate sample images acquired using the proposed 3D sequence for free-breathing body diffusion imaging using the motion correction system, in accordance with embodiments described herein.
Figure 7B:
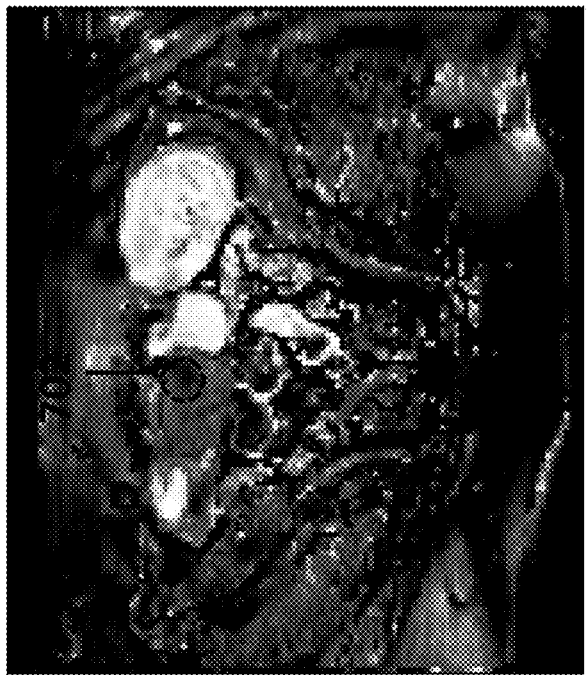
Figure 7C:
Figure 7D:
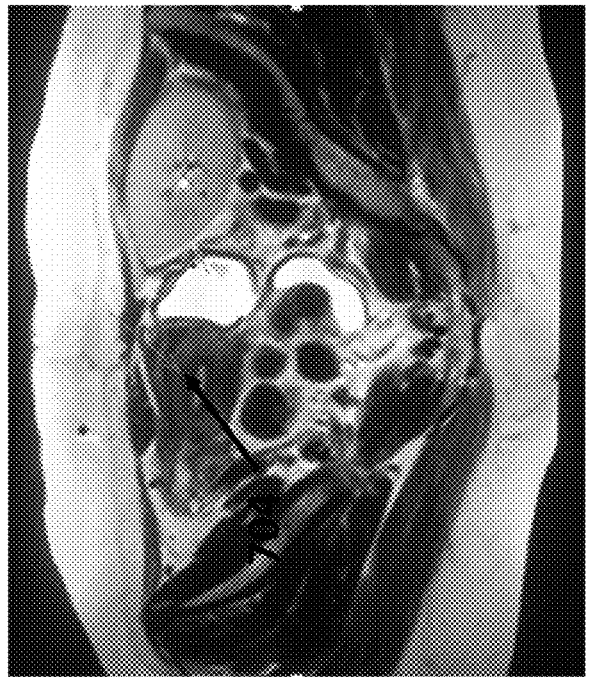

FIGS. 7A-7D illustrate sample images acquired using the proposed 3D sequence for free-breathing body diffusion imaging using the motion correction system, in accordance with embodiments described herein. Specifically, FIG. 7A depicts a diffusion-weighted (b=500 s/mm$^2$) image, FIG. 7B depicts an ADC map acquired from a patient being evaluated for a complex ovarian cyst and has left lower quadrant renal transplant. Note the elevated focal signal in the uterus (lightened circle 701 in FIG. 7A) and decreased ADC value (white circle 702 ADC value in suspicious lesion vs surrounding region: 0.5 vs 1.5 um$^2$/ms). FIG. 7C depicts a simultaneously acquired PET image that shows increased FDG uptake (circle 703) in the same region. This corresponds to punctate cystic structure and thickened junctional zone (arrow 704 on FIG. 7D, which depicts a T2 image) typically seen in adenomyosis. As shown in FIGS. 7A-7D, the complex right ovarian cyst had hemorrhagic material but no increased PET activity.

Figure 8:
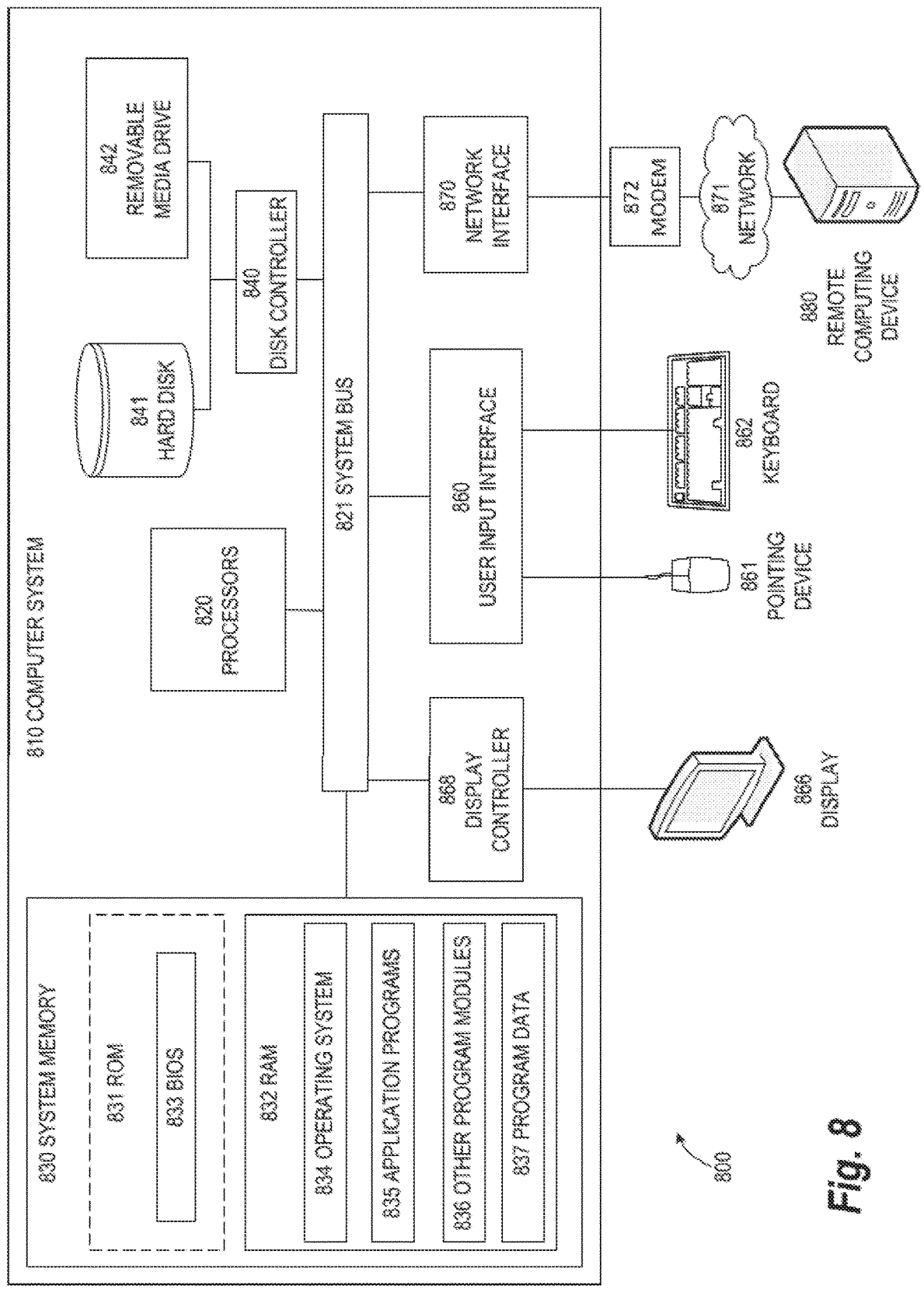
FIG. 8 illustrates an exemplary computing environment within which embodiments of the invention may be implemented.

FIG. 8 illustrates an exemplary computing environment 800 within which embodiments of the invention may be implemented. For example, the computing environment 800 may be used to implement one or more of the components illustrated in the medical imaging device 100 of FIG. 1. The computing environment 800 may include computer system 810, which is one example of a computing system upon which embodiments of the invention may be implemented. Computers and computing environments, such as computer system 810 and computing environment 800, are known to those of skill in the art and thus are described briefly here.

As shown in FIG. 8, the computer system 810 may include a communication mechanism such as a bus 821 or other communication mechanism for communicating information within the computer system 810. The computer system 810 further includes one or more processors 820 coupled with the bus 821 for processing the information. The processors 820 may include one or more central processing units (CPUs), graphical processing units (GPUs), or any other processor known in the art.

The computer system 810 also includes a system memory 830 coupled to the bus 821 for storing information and instructions to be executed by processors 820. The system memory 830 may include computer readable storage media in the form of volatile and/or nonvolatile memory, such as read only memory (ROM) 831 and/or random access memory (RAM) 832. The system memory RAM 832 may include other dynamic storage device(s) (e.g., dynamic RAM, static RAM, and synchronous DRAM). The system memory ROM 831 may include other static storage device(s) (e.g., programmable ROM, erasable PROM, and electrically erasable PROM). In addition, the system memory 830 may be used for storing temporary variables or other intermediate information during the execution of instructions by the processors 820. A basic input/output system (BIOS) 833 containing the basic routines that help to transfer information between elements within computer system 810, such as during start-up, may be stored in ROM 831. RAM 832 may contain data and/or program modules that are immediately accessible to and/or presently being operated on by the processors 820. System memory 830 may additionally include, for example, operating system 834, application programs 835, other program modules 836 and program data 837.

The computer system 810 also includes a disk controller 840 coupled to the bus 821 to control one or more storage devices for storing information and instructions, such as a hard disk 841 and a removable media drive 842 (e.g., floppy disk drive, compact disc drive, tape drive, and/or solid state drive). The storage devices may be added to the computer system 810 using an appropriate device interface (e.g., a small computer system interface (SCSI), integrated device electronics (IDE), Universal Serial Bus (USB), or FireWire).

The computer system 810 may also include a display controller 885 coupled to the bus 821 to control a display 866, such as a cathode ray tube (CRT) or liquid crystal display (LCD), for displaying information to a computer user. The computer system includes an input interface 880 and one or more input devices, such as a keyboard 882 and a pointing device 881, for interacting with a computer user and providing information to the processor 820. The pointing device 881, for example, may be a mouse, a trackball, or a pointing stick for communicating direction information and command selections to the processor 820 and for controlling cursor movement on the display 866. The display 866 may provide a touch screen interface which allows input to supplement or replace the communication of direction information and command selections by the pointing device 881.

The computer system 810 may perform a portion or all of the processing steps of embodiments of the invention in response to the processors 820 executing one or more sequences of one or more instructions contained in a memory, such as the system memory 830. Such instructions may be read into the system memory 830 from another computer readable medium, such as a hard disk 841 or a removable media drive 842. The hard disk 841 may contain one or more datastores and data files used by embodiments of the present invention. Datastore contents and data files may be encrypted to improve security. The processors 820 may also be employed in a multi-processing arrangement to execute the one or more sequences of instructions contained in system memory 830. In alternative embodiments, hard-wired circuitry may be used in place of or in combination with software instructions. Thus, embodiments are not limited to any specific combination of hardware circuitry and software.

As stated above, the computer system 810 may include at least one computer readable medium or memory for holding instructions programmed according to embodiments of the invention and for containing data structures, tables, records, or other data described herein. The term "computer readable medium" as used herein refers to any medium that participates in providing instructions to the processor 820 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 841 or removable media drive 842. Non-limiting examples of volatile media include dynamic memory, such as system memory 830. Non-limiting examples of transmission media include coaxial cables, copper wire, and fiber optics, including the wires that make up the bus 821. Transmission media may also take the form of acoustic or light waves, such as those generated during radio wave and infrared data communications.

The computing environment 800 may further include the computer system 810 operating in a networked environment using logical connections to one or more remote computers, such as remote computer 880. Remote computer 880 may be a personal computer (laptop or desktop), a mobile device, a server, a router, a network PC, a peer device or other common network node, and typically includes many or all of the elements described above relative to computer system 810. When used in a networking environment, computer system 810 may include modem 872 for establishing communications over a network 871, such as the Internet. Modem 872 may be connected to bus 821 via user network interface 870, or via another appropriate mechanism.

Network 871 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 810 and other computers (e.g., remote computer 880). The network 871 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 871.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

We claim:
1. A computer-implemented method for free breathing three dimensional diffusion imaging, the method comprising:
  initiating, via a k-space component processor, a motion robust diffusion/T2 preparation process comprising:
    generating diffusion contrast; and
    adjusting one or more of amplitude, duration, and polarity to null a first order moment;
  applying, via an image data processor, a non-Cartesian k-space ordering, comprising:
    acquiring a radial/spiral view for all members of a plurality of partitions in a partition-encoding direction;
    increasing an azimuthal angle until a complete set of radial/spiral views are sampled; and
    applying diffusion gradients along each of three axis simultaneously; and
  calculating, via the image data processor, an apparent diffusion coefficient map.
2. The method as recited in claim 1, further comprising:
  generating, via the k-space component processor, diffusion contrast through adding diffusion-sensitizing gradients to a T2-preparation module encompassing hard pulse excitation and adiabatic pulse refocusing.
3. The method as recited in claim 1, further comprising:
  combining, via the image data processor, along with the motion robust, non-Cartesian k-space ordering, one or more of a gradient-echo readout (steady-state free precession (SSFP), a fast low-angle shot (FLASH)), or a turbo spin-echo (TSE) readout.
4. The method as recited in claim 1, further comprising:
  additionally setting, via the k-space component processor, one or more of a b-value, T2-prep time to null the first order moment.

5. The method as recited in claim 1, further comprising:
setting, via the k-space component processor, one or more of a b-value, T2-prep time to null a second order moment or a higher moment.

6. The method as recited in claim 1, further comprising:
adjusting, via the k-space component processor, one or more of the amplitude, duration, and polarity to null a zeroth order moment.

7. The method as recited in claim 6, further comprising:
additionally setting, via the k-space component processor, one or more of the b-value, T2-prep time, to null the zeroth order moment.

8. The method as recited in claim 1, further comprising:
applying, via the k-space component processor, a spoiler gradient at the end of the diffusion/T2 preparation.

9. A computer program product for free breathing three dimensional diffusion imaging, the computer program product comprising a non-transitory computer readable storage medium having program instructions embodied therewith, the program instructions executable by a processor to cause the processor to:
initiate a motion robust diffusion/T2 preparation process comprising:
generate diffusion contrast; and
adjust one or more of amplitude, duration, and polarity to null a first order moment;
apply a motion robust non-Cartesian k-space ordering, comprising:
acquire a radial/spiral view for all members of a plurality of partitions in a partition-encoding direction;
increase an azimuthal angle until a complete set of radial/spiral views are sampled; and
apply diffusion gradients along each of three axis simultaneously; and
calculate an apparent diffusion coefficient map.

10. The computer program product as recited in claim 9, wherein the processor is further caused to:
generate diffusion contrast through adding diffusion-sensitizing gradients to a T2-preparation module encompassing hard pulse excitation and adiabatic pulse refocusing.

11. The computer program product as recited in claim 9, wherein the processor is further caused to:
combine, along with the stack of stars k-space ordering, one or more of a gradient-echo readout (steady-state free precession (SSFP) or a fast low-angle shot (FLASH)), or a turbo spin-echo (TSE) readout.

12. The computer program product as recited in claim 9, wherein the processor is further caused to:
additionally set one or more of a b-value, T2-prep time to null the first order moment.

13. The computer program product as recited in claim 9, wherein the processor is further caused to:
adjust one or more of the amplitude, duration, and polarity to null a second moment or a higher order moment.

14. The computer program product as recited in claim 9, wherein the processor is further caused to:
adjust one or more of the amplitude, duration, and polarity to null a zeroth order moment.

15. The computer program product as recited in claim 14, wherein the processor is further caused to:
additionally set one or more of the b-value, T2-prep time to null the zeroth order moment.

16. The computer program product as recited in claim 9, wherein the processor is further caused to:
apply a spoiler gradient at the end of the diffusion/T2 preparation.

17. A system for 3D motion correction for free breathing three dimensional diffusion imaging, the system comprising:
a medical imaging device comprising:
a k-space component processor configured to:
initiate a motion robust diffusion/T2 preparation process comprising:
generate diffusion contrast; and
adjust one or more of amplitude, duration, and polarity to null a first or second order moment; and
an image data processor configured to:
apply a motion robust non-Cartesian ordering, comprising:
acquire a radial/spiral view for all members of a plurality of partitions in a partition-encoding direction;
increase an azimuthal angle until a complete set of radial/spiral views are sampled; and
apply diffusion gradients along each of three axis simultaneously; and
calculate an apparent diffusion coefficient map.

18. The system as recited in claim 17, wherein the k-space component processor is further configured to:
generate diffusion contrast through adding diffusion-sensitizing gradients to a T2-preparation module encompassing hard pulse excitation and adiabatic pulse refocusing.

19. The system as recited in claim 17, wherein the k-space component processor is further configured to:
combine, along with the stack of stars k-space ordering, one or more of a steady-state free precession (SSFP) readout, a fast low-angle shot (FLASH) readout, or a turbo spin-echo (TSE) readout.

20. The system as recited in claim 17, wherein the k-space component processor is further configured to:
additionally set one or more of a b-value, T2-prep time to null the first order moment.

21. The system as recited in claim 17, wherein the k-space component processor is further configured to:
adjust one or more of the amplitude, duration, and polarity to null a zeroth order moment.

22. The system as recited in claim 21, wherein the k-space component processor is further configured to:
additionally set one or more of the b-value, T2-prep time to null the zeroth order moment.

23. The system as recited in claim 17, wherein the k-space component processor is further configured to:
adjust one or more of the amplitude, duration, and polarity to null the second moment or a higher order moment.

\* \* \* \* \*